United States Patent
Shu et al.

(10) Patent No.: US 10,177,257 B2
(45) Date of Patent: Jan. 8, 2019

(54) THIN FILM TRANSISTOR, METHOD FOR FABRICATING THE SAME, DISPLAY SUBSTRATE AND DISPLAY DEVICE

(71) Applicant: BOE TECHNOLOGY CO., LTD., Beijing (CN)

(72) Inventors: Shi Shu, Beijing (CN); Bin Zhang, Beijing (CN); Chuanxiang Xu, Beijing (CN); Yonglian Qi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 99 days.

(21) Appl. No.: 15/310,424

(22) PCT Filed: Feb. 14, 2016

(86) PCT No.: PCT/CN2016/073760
§ 371 (c)(1),
(2) Date: Nov. 10, 2016

(87) PCT Pub. No.: WO2017/049845
PCT Pub. Date: Mar. 30, 2017

(65) Prior Publication Data
US 2018/0182897 A1 Jun. 28, 2018

(30) Foreign Application Priority Data
Sep. 22, 2015 (CN) .......................... 2015 1 0609039

(51) Int. Cl.
*H01L 21/30* (2006.01)
*H01L 29/786* (2006.01)
(Continued)

(52) U.S. Cl.
CPC .... *H01L 29/78633* (2013.01); *H01L 21/3065* (2013.01); *H01L 21/3085* (2013.01);
(Continued)

(58) Field of Classification Search
CPC ............. H01L 21/3065; H01L 21/3085; H01L 21/31116; H01L 21/31138;
(Continued)

(56) References Cited

U.S. PATENT DOCUMENTS

| 5,624,861 | A | 4/1997 | Shibuya |
| 2002/0110941 | A1* | 8/2002 | Yamazaki ......... G02F 1/136213 |
| | | | 438/25 |

(Continued)

FOREIGN PATENT DOCUMENTS

| CN | 101345261 A | 1/2009 |
| CN | 103268855 A | 8/2013 |
| CN | 104536192 A | 4/2015 |
| CN | 105185714 A | 12/2015 |

OTHER PUBLICATIONS

Office Action in Chinese Application No. 201510609039.8 dated Aug. 28, 2017, with English translation.
(Continued)

*Primary Examiner* — Joseph Galvin, III
(74) *Attorney, Agent, or Firm* — Womble Bond Dickinson (US) LLP

(57) ABSTRACT

A thin film transistor, a method for fabricating the same, a display substrate, and a display device are disclosed. The method comprises: forming in sequence a light shielding layer, an insulating layer, and a semiconductor layer; and forming a pattern of the light shielding layer, the insulating layer, and the semiconductor layer in one patterning process. A polycrystalline silicon layer can be formed into an active layer and an amorphous silicon layer into the light shielding layer, by using only one mask. The number of masking processes is reduced by one, which simplifies a fabricating process of the thin film transistor.

14 Claims, 3 Drawing Sheets

(51) Int. Cl.
*H01L 27/12* (2006.01)
*H01L 21/3065* (2006.01)
*H01L 21/308* (2006.01)
*H01L 21/311* (2006.01)
*H01L 29/66* (2006.01)

(52) U.S. Cl.
CPC .. *H01L 21/31116* (2013.01); *H01L 21/31138* (2013.01); *H01L 21/31144* (2013.01); *H01L 27/12* (2013.01); *H01L 29/66757* (2013.01); *H01L 29/786* (2013.01); *H01L 29/78675* (2013.01)

(58) Field of Classification Search
CPC ......... H01L 21/31144; H01L 29/78633; H01L 29/66757; H01L 29/78675
See application file for complete search history.

(56) References Cited

U.S. PATENT DOCUMENTS

| | | | |
|---|---|---|---|
| 2008/0078991 A1* | 4/2008 | Kim | H01L 27/3272 257/40 |
| 2009/0009677 A1* | 1/2009 | Yamazaki | G02F 1/1368 349/43 |
| 2009/0014721 A1* | 1/2009 | Tanabe | H01L 29/66757 257/59 |
| 2016/0246139 A1 | 8/2016 | Li | |

OTHER PUBLICATIONS

International Search Report and Written Opinion in PCT/CN2016/073760 dated Jun. 28, 2016, with English translation. 15 pages.
"Second office action," CN Application No. 201510609039.8 (dated Mar. 15, 2018).

* cited by examiner

THIN FILM TRANSISTOR, METHOD FOR FABRICATING THE SAME, DISPLAY SUBSTRATE AND DISPLAY DEVICE

RELATED APPLICATIONS

The present application is the U.S. national phase entry of PCT/CN2016/073760, with an international filing date of Feb. 14, 2016, which claims the benefit of Chinese Patent Application No. 201510609039.8, filed on Sep. 22, 2015, the entire disclosures of which are incorporated herein by reference.

TECHNICAL FIELD

The present invention relates to the field of display, and particularly to a method for fabricating a thin film transistor, a thin film transistor, a display substrate, and a display device.

BACKGROUND

High PPI (Pixels Per Inch) products have currently become a main developing trend for display devices with a small or medium size. A top-gate structure is generally adopted in products, for purpose of realizing a TFT (thin film transistor) with improved characteristics to meet the charging demand of high PPI products.

However, the process for the top-gate structure is generally complicated, and there are numerous masking processes. Therefore, the cost and yield have become the concerns of the panel manufacturers. To prevent the strong light from a backlight from directly irradiating a back channel which would lead to leakage current, a light shielding layer is generally formed prior to the semiconductor layer. The light shielding layer is usually made from metal Mo, and a pattern is formed by a separate masking process.

In some products, the light shielding layer is omitted to decrease the number of masking processes and thus reduce the cost. Instead, the performance of these products is ensured by improving the process capacity of other portions in TFT and optimizing the pixel design. However, this solution is abandoned soon during upgrade of products, because a large leakage current is not acceptable for a high performance product. Thus, there is still a need for arranging the light shielding layer in the top gate structure.

SUMMARY

Embodiments of the present invention provide a method for fabricating a thin film transistor, comprising:
forming in sequence a light shielding layer, an insulating layer, and a semiconductor layer;
forming a pattern of the light shielding layer, the insulating layer, and the semiconductor layer in one patterning process.

In an embodiment, forming the pattern of the light shielding layer, the insulating layer, and the semiconductor layer in one patterning process comprises:
forming photoresist in a first region of the semiconductor layer;
etching the semiconductor layer to remove the semiconductor layer outside the first region;
etching the insulating layer for a first time to remove the insulating layer outside the first region;
treating the photoresist, so that the photoresist has a width which is smaller than a width of the first region, wherein the treated photoresist corresponds to a second region; and
etching the light shielding layer and the semiconductor layer, to remove the light shielding layer outside the first region and the semiconductor layer outside the second region.

In an embodiment, the method further comprises:
etching the insulating layer for a second time, so that the insulating layer has a width which is larger than a width of the second region and smaller than the width of the first region.

In an embodiment, etching the semiconductor layer comprises:
etching the semiconductor layer for about 110-120 seconds under conditions in which a flow ratio between $SF_6$ and $Cl_2$ is about 10/400-40/400, and a RF generator inputs a power of about 600-1000 W to plasma in a processing chamber.

In an embodiment, etching the insulating layer for the first time comprises:
etching the insulating layer for about 250-350 seconds under conditions in which a flow ratio between $CF_4$ and $O_2$ is about 200/40-200/20, and a RF generator inputs a power of about 600-1000 W to plasma in a processing chamber.

In an embodiment, treating the photoresist comprises:
ashing the photoresist.

In an embodiment, ashing the photoresist comprises:
ashing the photoresist for about 40-60 seconds under conditions in which a flow ratio between $SF_6$ and $O_2$ is about 20/400-40/400, and a RF generator inputs a power of about 350 W-450 W to plasma in a processing chamber.

In an embodiment, etching the light shielding layer and the semiconductor layer comprises:
etching the light shielding layer and the semiconductor layer for about 110-120 seconds under conditions in which a flow ratio between $SF_6$ and $Cl_2$ is about 10/400-40/400, and a RF generator inputs a power of about 600-1000 W to plasma in a processing chamber.

In an embodiment, etching the insulating layer for the second time comprises:
etching the insulating layer for about 35-45 seconds under conditions in which a flow ratio between $CF_4$ and $O_2$ is about 200/50-200/30, and a RF generator inputs a power of about 600-1000 W to plasma in a processing chamber; and
etching the insulating layer for about 18-22 seconds under conditions in which a flow ratio between $SF_6$ and $O_2$ is about 10/200-30/200, and the RF generator inputs a power of about 300-500 W to plasma in the processing chamber.

In an embodiment, prior to forming the photoresist in the first region of the semiconductor layer, the method further comprises:
forming a first amorphous silicon layer on a buffer layer as the light shielding layer;
forming the insulating layer on the light shielding layer;
forming a second amorphous silicon layer on the insulating layer;
annealing the second amorphous silicon layer, to convert the second amorphous silicon layer into a the polycrystalline silicon layer as the semiconductor layer.

In an embodiment, the buffer layer is made from $SiN_x$, and the insulating layer is made from $SiO_y$, wherein $1<x<2$, and $1<y<3$.

In an embodiment, after etching the insulating layer for the second time, the method further comprises:

peeling off the photoresist on the semiconductor layer;

forming a gate insulating layer on the semiconductor layer;

forming a gate on the gate insulating layer;

forming an interlayer dielectric layer on the gate; and forming a source and a drain on the interlayer dielectric layer, wherein the source and the drain are electrically connected with the semiconductor layer by via holes in the interlayer dielectric layer and the gate insulating layer.

The present invention further provides a thin film transistor, comprising: a light shielding layer;

an insulating layer arranged on the light shielding layer; and a semiconductor layer arranged on the insulating layer.

In an embodiment, the amorphous silicon layer has a width which is larger than a width of the insulating layer, and the width of the insulating layer is larger than a width of the polycrystalline silicon layer.

In an embodiment, the method further comprises:

a gate insulating layer arranged on the semiconductor layer;

a gate arranged on the gate insulating layer;

an interlayer dielectric layer arranged on the gate; and a source and a drain arranged on the interlayer dielectric layer, wherein the source and the drain are electrically connected with the semiconductor layer by via holes in the interlayer dielectric layer and the gate insulating layer.

An embodiment of the present invention further provides a display substrate, comprising the thin film transistor as described above.

An embodiment of the present invention further provides a display device, comprising the display substrate as described above.

According to the above technical solutions, a polycrystalline silicon layer can be formed into an active layer and an amorphous silicon layer into the light shielding layer, by using only one mask. As compared with the existing method in which a light shielding layer is formed from a metal below the active layer by using an additional mask, the number of masking processes is reduced by one, which simplifies a fabricating process of the thin film transistor.

BRIEF DESCRIPTION OF THE DRAWINGS

These and other aspects of the invention are apparent from and will be further elucidated, by way of example, with reference to the drawings, in which.

DETAILED DESCRIPTION OF EMBODIMENTS

Figure 1:
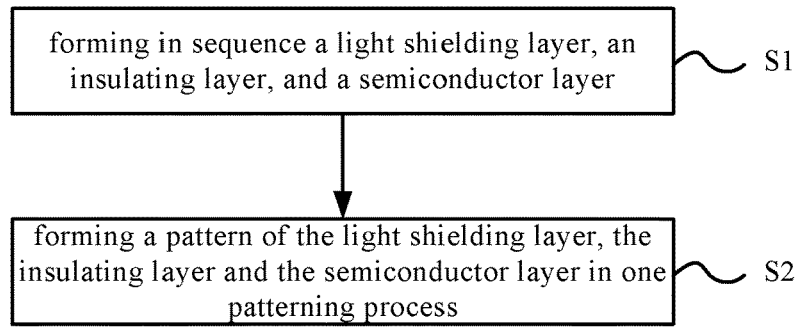
FIG. 1 is a schematic flow chart illustrating a method for fabricating a thin film transistor in an embodiment of the present invention.

The above objects, features and advantages of the present invention will become apparent from the following detailed description, taken in conjunction with the accompanying drawings and specific embodiments. It is noted that embodiments and features in embodiments of the present application can be combined in case no conflict occurs.

In the following description, details will be presented for fully understanding the present invention, but the present invention can be implemented in a manner other than the embodiments described herein. Thus, the following embodiments are only used for explaining more clearly the technical solution of the present invention rather than limiting the protection scope of the present invention.

Reference numerals: 1 light shielding layer; 2 insulating layer; 3 semiconductor layer; 4 photoresist; 5 buffer layer; 6 gate insulating layer; 7 gate; 8 interlayer dielectric layer; 9 substrate; 10 first region; 11 source; 12 drain; 20 second region.

Figure 3:
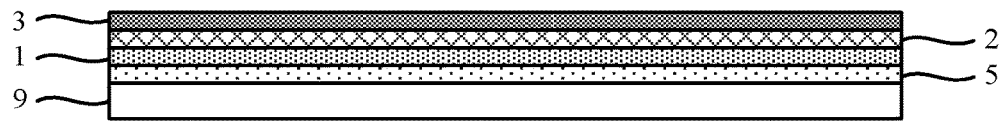
FIGS. 3, 4, 5, 6, 7, 8, 9, and 10 are schematic flow charts illustrating a method for fabricating a thin film transistor in an embodiment of the present invention.

As shown in FIG. 1, in an embodiment of the present invention, a method for fabricating a thin film transistor comprises the following steps:

S1, forming in sequence a light shielding layer 1, an insulating layer 2, and a semiconductor layer 3, as shown in FIG. 3; and S2, forming a pattern of the light shielding layer 1, the insulating layer 2 and the semiconductor layer 3 in one patterning process.

As shown in FIG. 3, the structure of the thin film transistor is arranged on a substrate 9. For simplicity, the reference numeral for the substrate 9 is not shown in FIGS. 4-10.

Figure 2:
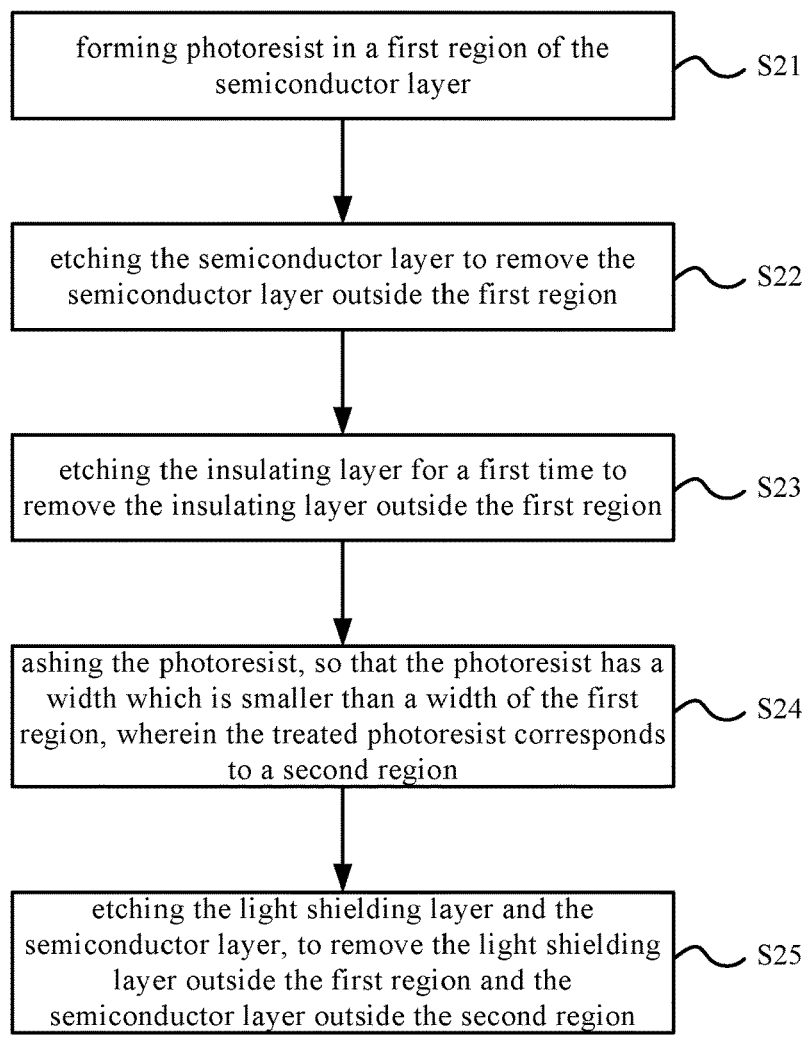
FIG. 2 is a schematic flow chart illustrating a method for fabricating a thin film transistor in an embodiment of the present invention.
Figure 4:
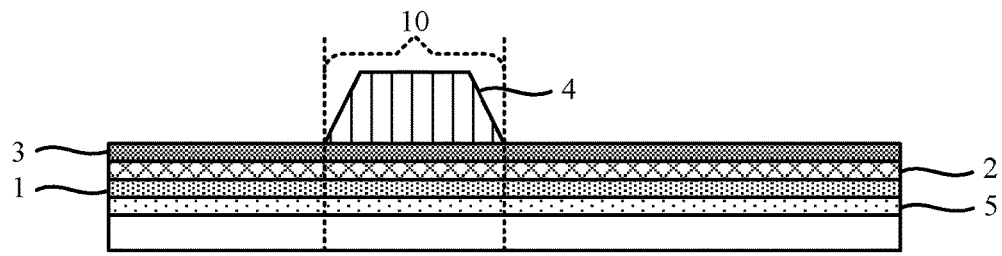
Figure 5:
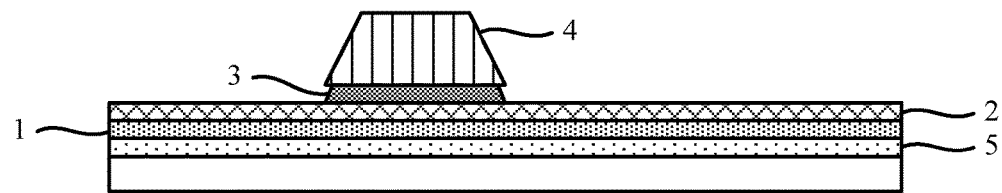
Figure 6:
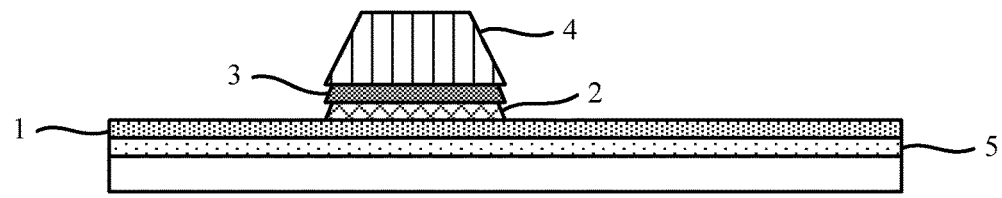
Figure 7:
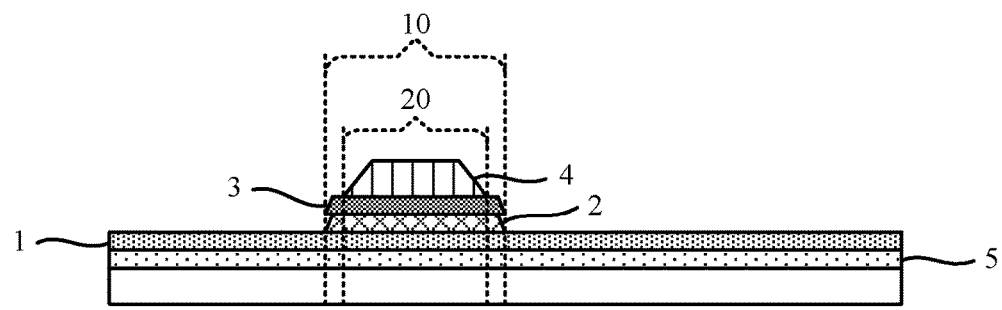
Figure 8:
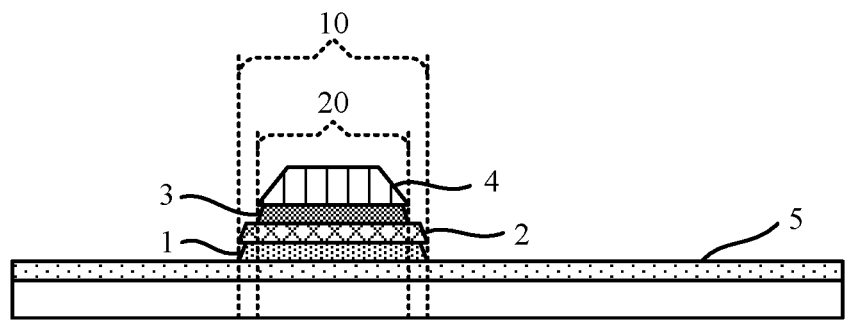

As shown in FIG. 2, for example, forming the pattern of the light shielding layer 1, the insulating layer 2, and the semiconductor layer 3 in one patterning process comprises the following steps:

S21, forming photoresist 4 in a first region 10 of the semiconductor layer 3, as shown in FIG. 4;

S22, etching the semiconductor layer 3 to remove the semiconductor layer outside the first region 10, as shown in FIG. 5;

S23, etching the insulating layer 2 for a first time to remove the insulating layer outside the first region 10, as shown in FIG. 6;

S24, treating the photoresist 4, so that the photoresist 4 has a width which is smaller than a width of the first region 10, wherein the treated photoresist corresponds to a second region 20, as shown in FIG. 7; and S25, etching the light shielding layer 1 and the semiconductor layer 3, to remove the light shielding layer 1 outside the first region 10 and the semiconductor layer 3 outside the second region 20, as shown in FIG. 8.

In the present embodiment, the light shielding layer, the insulating layer, and the semiconductor layer are retained on the photoresist after the etching process. As a result, etching of the light shielding layer, the insulating layer, and the semiconductor layer can be performed by using a mask corresponding to the photoresist.

The resulting semiconductor layer can function as an active layer, and the insulating layer can prevent the light shielding layer from affecting electrical performance of the polycrystalline silicon layer. In the present embodiment, a polycrystalline silicon layer can be formed into the active layer and an amorphous silicon layer into the light shielding layer, by using only one mask. As compared with the existing method in which a light shielding layer is formed from a metal below the active layer by using an additional mask, the number of masking processes is reduced by one, which simplifies a fabricating process of the thin film transistor.

Figure 9:
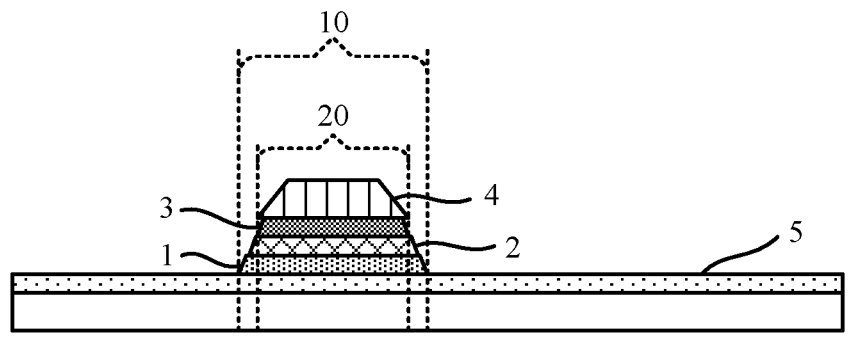

For example, the method further comprises the following steps: S26, etching the insulating layer 2 for a second time, so that the insulating layer 2 has a width which is larger than a width of the second region 20 and smaller than the width of the first region 10, as shown in FIG. 9.

In the present embodiment, a structure in which the light shielding layer, the insulating layer, and the semiconductor layer decrease successively in width can be formed. Such a structure ensures electrical performance of the active layer made from the three-layer structure. The light shielding layer in the lowest layer can provide an enhanced light shielding effect for the semiconductor layer, so that the light from the bottom side is prevented from irradiating the semiconductor layer.

For example, step S22 of etching the semiconductor layer 3 comprises: etching the semiconductor layer 3 for 110-120 seconds under conditions in which a flow ratio between $SF_6$ and $Cl_2$ is about 10/400-40/400, and a RF generator inputs a power of about 600-1000 W to plasma in a processing chamber.

For example, in step S22, the semiconductor layer 3 can be etched for 115 seconds under conditions in which the flow ratio between $SF_6$ and $Cl_2$ is 20/400, and the RF generator inputs a power of 800 W to plasma in the processing chamber.

The semiconductor layer 3 can be made from polycrystalline silicon, $Cl_2$ can provide Cl element for etching polycrystalline silicon, and $SF_6$ can provide F element for etching polycrystalline silicon. $Cl_2$ can effectively etch polycrystalline silicon. $SF_6$ doped in $Cl_2$ facilitates etching, and thus increases the etching rate.

For example, etching the insulating layer 2 for the first time in step S23 comprises: etching the insulating layer 2 for 250-350 seconds under conditions in which a flow ratio between $CF_4$ and $O_2$ is about 200/40-200/20, and the RF generator inputs a power of about 600-1000 W to plasma in the processing chamber.

For example, in step S23, the insulating layer 2 can be etched for 200 seconds under conditions in which the flow ratio between $CF_4$ and $O_2$ is 200/40, and the RF generator inputs a power of 800 W to plasma in the processing chamber.

The insulating layer 2 can be made from $SiO_y$, wherein $1<y<3$. $CF_4$ can provide F element during etching. Adding $O_2$ in the etching gas facilitates forming a tapering angle during etching.

For example, treating the photoresist 4 in step S24 comprises: ashing the photoresist 4.

In addition, after ashing, the photoresist has a decreased width to expose a portion of the polycrystalline silicon layer below the photoresist. Thus, during etching the amorphous silicon layer, the exposed portion of the polycrystalline silicon layer below the photoresist can be etched at the same time, so that the width of the polycrystalline silicon layer is decreased. Thus, it is not necessary to etch the polycrystalline silicon layer separately, which decreases the times of arranging a mask and simplifies the fabricating process.

For example, in step S24, ashing the photoresist 4 comprises:

ashing the photoresist for about 40-60 seconds under conditions in which a flow ratio between $SF_6$ and $O_2$ is about 20/400-40/400, and the RF generator inputs a power of about 350 W-450 W to plasma in the processing chamber.

For example, in step S24, the photoresist 4 can be ashed for 50 seconds under conditions in which the flow ratio between $SF_6$ and $O_2$ is 30/400, and the RF generator inputs a power of 400 W to plasma in the processing chamber.

For example, etching the light shielding layer 1 and the semiconductor layer 3 in step S25 comprises:

etching the light shielding layer 1 and the semiconductor layer 3 for 110-120 seconds under conditions in which the flow ratio between $SF_6$ and $Cl_2$ is about 10/400-40/400, and the RF generator inputs a power of about 600-1000 W to plasma in the processing chamber.

For example, in step S25, the light shielding layer 1 and the semiconductor layer 3 can be etched for 115 seconds under conditions in which the flow ratio between $SF_6$ and $Cl_2$ is 20/400, and the RF generator inputs a power of 800 W to plasma in the processing chamber.

For example, etching the insulating layer 2 for the second time in step S26 comprises:

etching the insulating layer 2 for 35-45 seconds under conditions in which the flow ratio between $CF_4$ and $O_2$ is about 200/50-200/30, and the RF generator inputs a power of about 600-1000 W to plasma in the processing chamber; and etching the insulating layer 2 for 18-22 seconds under conditions in which the flow ratio between $SF_6$ and $O_2$ is about 10/200-30/200, and the RF generator inputs a power of about 300-500 W to plasma in the processing chamber.

For example, in step S26, the insulating layer 2 is firstly etched for 40 seconds under conditions in which the flow ratio between $CF_4$ and $O_2$ is 200/40, and the RF generator inputs a power of 800 W to plasma in the processing chamber; and the insulating layer 2 is then etched for 20 seconds under conditions in which the flow ratio between $SF_6$ and $O_2$ is 20/200, and the RF generator inputs a power of 400 W to plasma in the processing chamber.

According to the pattern of the light shielding layer, the insulating layer, and the semiconductor layer formed under the above etching conditions, a structure in which the light shielding layer has a width larger than that of the insulating layer and the insulating layer has a width larger than that of the semiconductor layer, i.e., the light shielding layer, the insulating layer, and the semiconductor layer gradually decrease in width in a upward direction, can be formed conveniently. As a result, the light shielding layer can completely block the light from the bottom side which otherwise would irradiate the semiconductor layer.

By etching under the above conditions, the resulting light shielding layer, insulating layer and semiconductor layer have a dense structure and smooth surface. It is ensured that the semiconductor layer has excellent electrical performance, and the insulating layer can insulate the light shielding layer from the semiconductor layer in a satisfactory way.

In the present embodiment, etching the insulating layer for the second time can also be divided into two steps, wherein a first etching step can reduce the width of the insulating layer, and a second etching step mainly etch the photoresist. The polycrystalline silicon layer, the insulating layer, and the amorphous silicon layer are subject to several etching processes, so that the photoresist is prone to be modified. The second etching step can etch away the modified photoresist at the surface. In this way, the photoresist can be conveniently removed subsequently.

For example, prior to forming the photoresist 4 in the first region 10 of the semiconductor layer 3 in step S21, the method further comprises:

forming a first amorphous silicon layer on a buffer layer 5 as the light shielding layer 1;

forming the insulating layer 2 on the light shielding layer 1;

forming a second amorphous silicon layer on the insulating layer 2; and annealing the second amorphous silicon layer, to convert the second amorphous silicon layer into a polycrystalline silicon layer which acts as the semiconductor layer 3.

For example, the buffer layer 5 is made from $SiN_x$, wherein $1<x<2$. For example, in case $x=4/3$, $SiN_x$ is $Si_3N_4$. The insulating layer 2 is made from $SiO_y$, wherein $1<y<3$.

For example, in case y=2, SiO$_y$ can be SiO$_2$. SiO$_y$ shows excellent insulating performance, and is easy to etch, which can ensure the etching effect.

Figure 10:
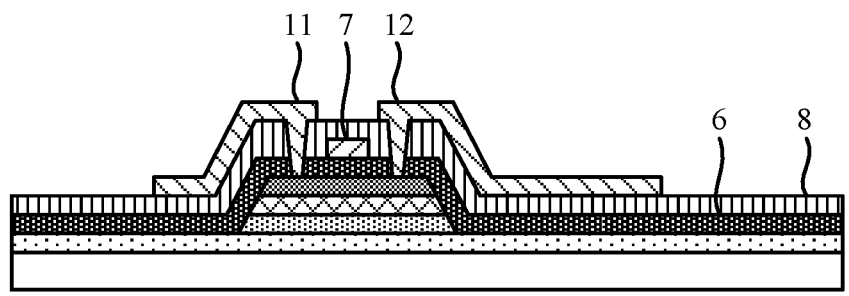

As shown in FIG. 10, for example, after etching the insulating layer 2 for the second time in step S26, the method further comprises:

peeling off the photoresist 4 on the semiconductor layer 3;

forming a gate insulating layer 6 on the semiconductor layer 3;

form a gate 7 on the gate insulating layer 6;

forming an interlayer dielectric layer 8 on the gate 7; and forming a source 11 and a drain 12 on the interlayer dielectric layer 8, which are electrically connected with the semiconductor layer 3 by via holes in the interlayer dielectric layer 8 and the gate insulating layer 6.

The forming process in the flow chart for example can comprise a film-forming process like depositing, sputtering, and a patterning process like etching.

In the present embodiment, after the source and the drain are formed, conventional structures in the display substrate such as a passivation layer, a common electrode, and a pixel electrode can be formed, and description thereof is omitted.

As shown in FIG. 10, an embodiment of the present invention further provides a thin film transistor, comprising:

the light shielding layer 1;

the insulating layer 2 which is arranged on the light shielding layer 1; and the semiconductor layer 3 which is arranged on the insulating layer 2.

For example, the light shielding layer 1 has a width larger than that of the insulating layer 2, and the width of the insulating layer 2 is larger than that of the semiconductor layer 3.

For example, the thin film transistor further comprises:

the gate insulating layer 6 which is arranged on the semiconductor layer 3;

the gate 7 which is arranged on the gate insulating layer 6;

the interlayer dielectric layer 8 which is arranged on the gate 7; and the source 11 and the drain 12, which are arranged on the interlayer dielectric layer 8, and electrically connected with the semiconductor layer 3 by via holes in the interlayer dielectric layer 8 and the gate insulating layer 6.

An embodiment of the present invention further provides a display substrate, comprising the thin film transistor as described above.

An embodiment of the present invention further provides a display device, comprise the display substrate as described above.

It is noted that the display device in the present embodiment can be any product or component with a display function, e.g., a display panel, a electronic paper, a mobile paper, a tablet computer, a TV set, a notebook computer, a digital photo frame, a navigator.

The technical solutions of embodiments of the present invention have been described above with reference to the accompanying drawings. In the existing technique, a top-gate thin film transistor needs a separate masking process to form the light shielding layer, so that the whole process is relatively tedious. According to technical solutions of embodiments of the present invention, the polycrystalline silicon layer can be formed into the active layer and the amorphous silicon layer into the light shielding layer, by using only one mask. As compared with the existing method in which the light shielding layer is formed from a metal below the active layer by using an additional mask, the number of masking processes is reduced by one, which simplifies a fabricating process of the thin film transistor.

In the drawings, sizes of layers and regions may be exaggerated for clarity. It will be understood that when an element or layer is referred to as being "on" another element or layer, it can be directly on the other element or layer, or an intervening layer may be present. It will be understood that when an element or layer is referred to as being "below" another element or layer, it can be directly below the other element or layer, or one or more intervening layer may be present. It will further be understood that when an element or layer is referred to as being "between" two elements or layers, it can be the unique element or layer between these elements or layers, or one or more intervening layer may be present. Like reference numerals refer to like parts throughout the specification.

In embodiments of the present invention, the terms "first", "second" are used for purpose of describing, instead of indicating or implying relative importance.

The above contents are only the preferred embodiments of the present invention, and it should be pointed out that for those having ordinary skills in the art, several improvements and modifications can also be made on the premise of not diverging from the technical principles of the present invention, and these improvements and modifications should also be deemed as falling within the protection scope of the present invention.

What is claimed is:

1. A method for fabricating a thin film transistor, comprising:

forming in sequence a light shielding layer, an insulating layer, and a semiconductor layer; and forming a pattern of the light shielding layer, the insulating layer, and the semiconductor layer in a patterning process using only one mask, wherein the forming the pattern of the light shielding layer, the insulating layer, and the semiconductor layer in the patterning process using only one mask comprises:

forming a photoresist in a first region of the semiconductor layer;

etching the semiconductor layer to remove the semiconductor layer outside the first region;

etching the insulating layer for a first time to remove the insulating layer outside the first region;

treating the photoresist, so that the photoresist has a width which is smaller than a width of the first region, wherein the treated photoresist corresponds to a second region; and etching the light shielding layer and the semiconductor layer, to remove the light shielding layer outside the first region and the semiconductor layer outside the second region.

2. The method of claim 1, further comprising:

etching the insulating layer for a second time, so that the insulating layer has a width which is larger than a width of the second region and smaller than the width of the first region.

3. The method of claim 2, wherein etching the insulating layer for the second time comprises:

etching the insulating layer for about 35-45 seconds under conditions in which a flow ratio between $CF_4$ and $O_2$ is about 200/50-200/30, and a RF generator inputs a power of about 600-1000 W to plasma in a processing chamber; and etching the insulating layer for about 18-22 seconds under conditions in which a flow ratio between $SF_6$ and $O_2$ about is 10/200-30/200, and the RF generator inputs a power of about 300-500 W to plasma in the processing chamber.

4. The method of claim 3, wherein after etching the insulating layer for the second time, the method further comprises:
peeling off the photoresist on the semiconductor layer;
forming a gate insulating layer on the semiconductor layer;
forming a gate on the gate insulating layer;
forming an interlayer dielectric layer on the gate; and
forming a source and a drain on the interlayer dielectric layer, wherein the source and the drain are electrically connected with the semiconductor layer by via holes in the interlayer dielectric layer and the gate insulating layer.

5. The method of claim 2, wherein after etching the insulating layer for the second time, the method further comprises:
peeling off the photoresist on the semiconductor layer;
forming a gate insulating layer on the semiconductor layer;
forming a gate on the gate insulating layer;
forming an interlayer dielectric layer on the gate; and
forming a source and a drain on the interlayer dielectric layer, wherein the source and the drain are electrically connected with the semiconductor layer by via holes in the interlayer dielectric layer and the gate insulating layer.

6. The method of claim 2, wherein prior to forming the photoresist in the first region of the semiconductor layer, the method further comprises:
forming a first amorphous silicon layer on a buffer layer as the light shielding layer;
forming the insulating layer on the light shielding layer;
forming a second amorphous silicon layer on the insulating layer; and
annealing the second amorphous silicon layer, to convert the second amorphous silicon layer into a polycrystalline silicon layer as the semiconductor layer.

7. The method of claim 1, wherein etching the semiconductor layer comprises:
etching the semiconductor layer for about 110-120 seconds under conditions in which a flow ratio between $SF_6$ and $Cl_2$ is about 10/400-40/400, and a RF generator inputs a power of about 600-1000 W to plasma in a processing chamber.

8. The method of claim 7, wherein prior to forming the photoresist in the first region of the semiconductor layer, the method further comprises:
forming a first amorphous silicon layer on a buffer layer as the light shielding layer;
forming the insulating layer on the light shielding layer;
forming a second amorphous silicon layer on the insulating layer; and
annealing the second amorphous silicon layer, to convert the second amorphous silicon layer into a polycrystalline silicon layer as the semiconductor layer.

9. The method of claim 1, wherein etching the insulating layer for the first time comprises:
etching the insulating layer for about 250-350 seconds under conditions in which a flow ratio between $CF_4$ and $O_2$ is about 200/40-200/20, and a RF generator inputs a power of about 600-1000 W to plasma in a processing chamber.

10. The method of claim 1, wherein treating the photoresist comprises:
ashing the photoresist.

11. The method of claim 10, wherein ashing the photoresist comprises:
ashing the photoresist for about 40-60 seconds under conditions in which a flow ratio between $SF_6$ and $O_2$ is about 20/400-40/400, and a RF generator inputs a power of about 350 W-450 W to plasma in a processing chamber.

12. The method of claim 1, wherein etching the light shielding layer and the semiconductor layer comprises:
etching the light shielding layer and the semiconductor layer for about 110-120 seconds under conditions in which a flow ratio between $SF_6$ and $Cl_2$ is about 10/400-40/400, and a RF generator inputs a power of about 600-1000 W to plasma in a processing chamber.

13. The method of claim 1, wherein prior to forming the photoresist in the first region of the semiconductor layer, the method further comprises:
forming a first amorphous silicon layer on a buffer layer as the light shielding layer;
forming the insulating layer on the light shielding layer;
forming a second amorphous silicon layer on the insulating layer; and
annealing the second amorphous silicon layer, to convert the second amorphous silicon layer into a polycrystalline silicon layer as the semiconductor layer.

14. The method of claim 13, wherein the buffer layer is made from $SiN_x$, and the insulating layer is made from $SiO_y$, wherein $1<x<2$ and $1<y<3$.

* * * * *